(12) United States Patent
Ishikawa et al.

(10) Patent No.: US 6,771,112 B1
(45) Date of Patent: Aug. 3, 2004

(54) SEMICONDUCTOR INTEGRATED CIRCUIT HAVING PADS WITH LESS INPUT SIGNAL ATTENUATION

(75) Inventors: Tsutomu Ishikawa, Ohta (JP); Hiroshi Kojima, Gunma-ken (JP)

(73) Assignee: Sanyo Electric Co., Inc. (JP)

( * ) Notice: Subject to any disclaimer, the term of this patent is extended or adjusted under 35 U.S.C. 154(b) by 0 days.

(21) Appl. No.: 09/552,085

(22) Filed: Feb. 24, 2000

(30) Foreign Application Priority Data

Feb. 26, 1999 (JP) .......................................... 11-050734
Feb. 26, 1999 (JP) .......................................... 11-050735

(51) Int. Cl.[7] .......................................... H03K 17/687
(52) U.S. Cl. ......................... 327/427; 327/382; 327/566
(58) Field of Search ................................ 327/382, 379, 327/108, 427, 430, 383, 387, 579, 564–556, 581, 308, 310, 389; 257/355, 545, 546, 547, 386, 389; 438/149

(56) References Cited

U.S. PATENT DOCUMENTS

| | | | | |
|---|---|---|---|---|
| 4,675,561 A | * | 6/1987 | Bowers | 327/382 |
| 4,700,461 A | * | 10/1987 | Choi et al. | 438/149 |
| 4,875,019 A | * | 10/1989 | Monson et al. | 330/302 |
| 5,469,104 A | * | 11/1995 | Smith et al. | 327/541 |
| 5,534,815 A | * | 7/1996 | Badyal | 327/382 |
| 5,550,503 A | * | 8/1996 | Garrity et al. | 327/382 |
| 5,847,381 A | * | 12/1998 | Isogai | 257/292 |
| 6,175,278 B1 | * | 1/2001 | Hasegawa | 330/378 |

OTHER PUBLICATIONS

Weste et al., "Principles of CMOS VLSI Design: A Systems Perspective", 1994, Addison–Wesley Publishing Company, $2^{nd}$ edition, pp. 183–186.*

* cited by examiner

Primary Examiner—Long Nguyen
(74) Attorney, Agent, or Firm—Cantor Colburn LLP

(57) ABSTRACT

An integrated semiconductor device is provided that has pads with less input signal attenuation. When J-FET (2) is driven by an input signal, the current passing through it varies. The parasitic capacitance (4) is charged or discharged by the input/output signal of the buffer circuit (6) following the varying current. Thus, since the voltage across the parasitic capacitance (3) varies in phase and at the same level, the parasitic capacitance (3) can be ignored. This effect allows attenuation of an input signal due to the parasitic capacitance (3) to be prevented.

7 Claims, 7 Drawing Sheets

SEMICONDUCTOR INTEGRATED CIRCUIT HAVING PADS WITH LESS INPUT SIGNAL ATTENUATION

BACKGROUND OF THE INVENTION (a) Field of the Invention

The present invention relates to a semiconductor integrated circuit that employs pads providing less input signal attenuation.

(b) Description of Related Art

Junction field-effect transistors (abbreviated as J-FETS) are generally used for special applications such as condenser microphones because they have a high input impedance, compared with bipolar elements, and a high electrostatic withstand voltage, compared MOS FET elements. Moreover, J-FETs are used for small signal amplification because of less noise over low-frequencies and good high-frequency characteristics. Recently, J-FETs built in a bipolar integrated circuit are being developed.

FIG. 6 shows an integrated circuit integrating a J-FET. A signal is applied to the gate of the J-FET 2 from an external circuit via a pad 1 formed on an integrated substrate. The external input signal varies the gate voltage of the J-FET 2, thus varying the current amount flowing through the J-FET 2. The load resistance RL converts the current into a voltage to output the converted voltage.

In the integrated circuit shown in FIG. 6, two parasitic capacitance components occur between the pad 1 and the substrate. Referring to the cross section of an integrated pad shown in FIG. 7, an island region 102 is defined between two isolation regions 101. A metal 103 is formed over the island region 102. In such an integrated configuration, a MOS capacitance (or parasitic capacitance) 3 is formed between the island region 102 and the metal 103. A junction capacitance (or parasitic capacitance) 4 is formed between the island region 102 and the substrate. The juncture between the pad 1 and the gate of the J-FET 2, as shown in FIG. 3, is grounded via the parasitic capacitances 3 and 4. Where an element with a high output impedance, for example, a capacitor of a small capacitance, is connected to the pad 1, both the parasitic capacitances 3 and 4 may appear as a very large capacitance, compared with the small capacitor. Particularly, when the area of the pad 1 is made large to use the circuit of FIG. 3 for a special application, the parasitic capacitance becomes even larger so that the difference between the capacitance of the small capacitor and the parasitic capacitance becomes noticeable. As a result, since the pad 1 attenuates the input signal applied to the gate of the J-FET 2, it is difficult to erroneously obtain the input signal.

SUMMARY OF THE INVENTION

This invention is made to overcome the above-mentioned problems. It is an object of the present invention to provide a semiconductor integrated circuit including pads each with a high input impedance and with a low capacitance.

The pad is connected to a buffer circuit that charges and discharges the parasitic capacitance. Thus, the charging amount of the parasitic capacitance varies according to an input signal so that attenuation of an input signal can be prevented.

The pad is connected to a source follower circuit that charges and discharges the parasitic capacitance. Thus, the charging amount of the parasitic capacitance varies according to an input signal so that attenuation of an input signal can be prevented.

BRIEF DESCRIPTION OF THE DRAWINGS

These and other objects, features, and advantages of the present invention will become more apparent upon a reading of the following detailed description and drawings, in which.

DESCRIPTION OF THE EMBODIMENTS

Preferred embodiments according to the present invention will be described below by referring to the attached drawings.

Figure 1:
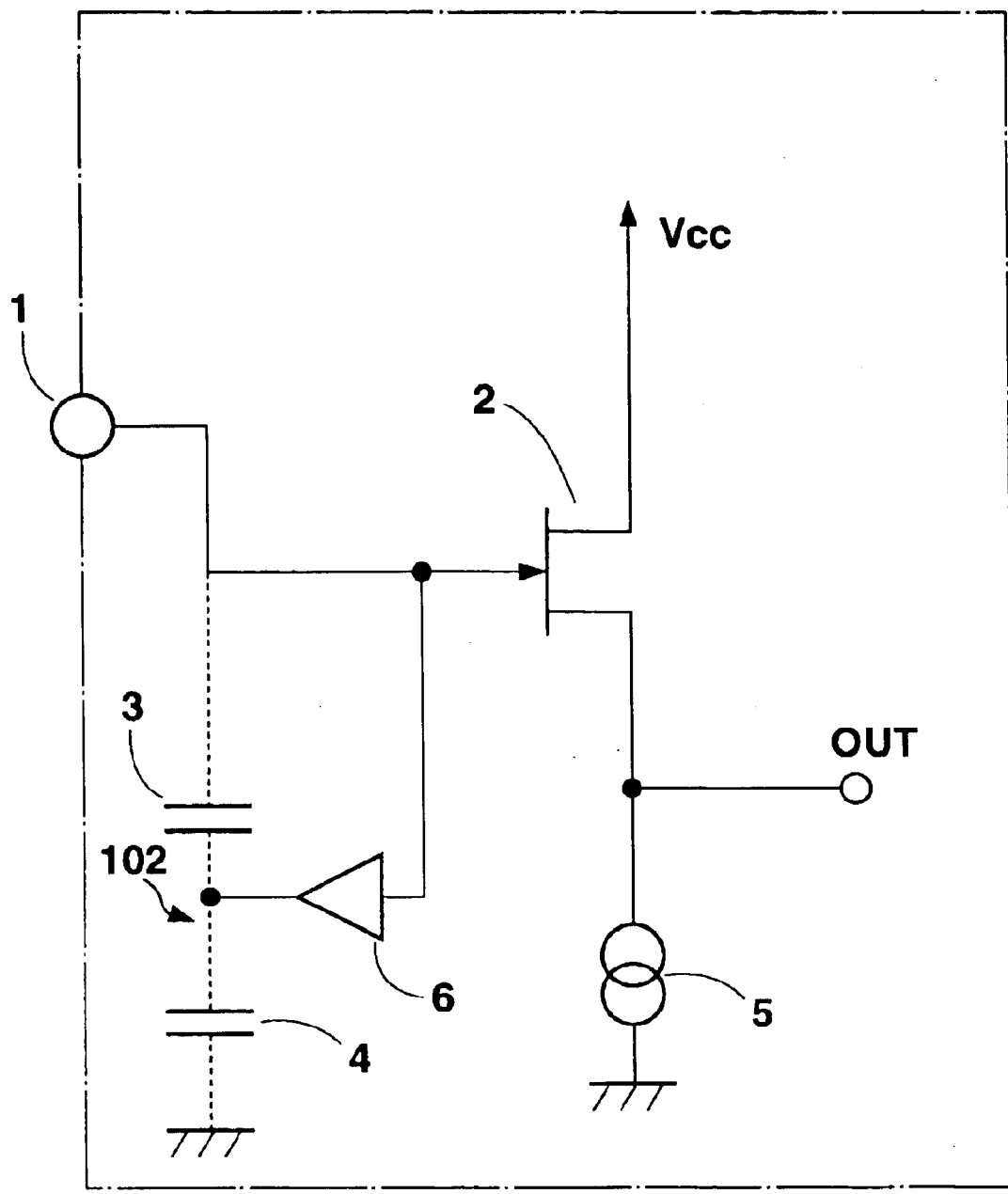
FIG. 1 is a circuit diagram illustrating an integrated circuit according to an embodiment of the present invention.

FIG. 1 is a diagram illustrating the configuration of a semiconductor integrated circuit according to an embodiment of the present invention. A pad 1 is connected to the gate of the J-FET 2 to receive an input signal. The J-FET 2 has a drain connected to a power source VCC and a source connected to the ground via the constant current source 5. An output signal OUT is output from the juncture between the source of the J-FET 2 and the constant current source 4.

The pad is connected to the buffer circuit 6. The buffer circuit 6 has its output terminal connected to the juncture between the parasitic capacitances 3 and 4. The parasitic capacitance 3, as shown in FIG. 1, corresponds to a MOS capacitance created between the pad 1 and the island region 102. The parasitic capacitance 4 corresponds to a junction capacitance created between the island region 102 and the substrate. Thus, the output terminal of the buffer circuit 6 is connected to the island region 102.

In this embodiment, the substrate is formed of silicon containing P-type impurities. The island region contains impurities of an N-type conductivity opposite to the P-type conductivity. The oxide film is formed of SiO2. The pad 1 is formed of aluminum. The isolation region 101 is a $P^+$ region where P-type impurities are heavily doped.

Referring again to FIG. 1, the circuit is completely packaged in a semiconductor integrated circuit. The buffer amplifier is preferably an amplifier with an amplification factor of 1.

Referring to FIG. 1, when a positive input signal is input to the gate of the J-FET 2, the current flowing through the J-FET 2 increases so that the current component exceeding the specific current of the constant current source 5 is supplied to the buffer circuit 6. The buffer circuit 6 supplies the increased output current to charge the parasitic capacitance 4 so that the voltage at the junction between the parasitic capacitances 3 and 4 increases. As the gate voltage of the J-FET 2 increases, the voltage at the juncture between the parasitic capacitances 3 and 4 increases.

In contrast, when a negative input signal is input to the gate of the J-FET 2, the current flowing through the J-FET 2 decreases less than a constant current of the constant current source 5. The parasitic capacitance 4 is discharged due to the output current of the buffer circuit 6. The decrease in voltage at the juncture between the parasitic capacitances 3 and 4 causes the juncture voltage to decrease according to a decrease in the gate voltage of the J-FET 2.

The buffer circuit 6 can vary the voltages at both the terminals of the parasitic capacitance 3 in phase. The charging and discharging amount of the parasitic capacitances 3 and 4 can be adjusted by controlling the buffer circuit 6. As a result, the voltage at the juncture between the capacitances 3 and 4 can be varied to the level of the input signal. Oscillating the voltage across the parasitic capacitance 3 in phase and at the same level can eliminate a change in charge of the parasitic capacitance 3. The parasitic capacitance 3 viewed from the input pad 1 can be effectively neglected. As a result, since only the parasitic capacitance 4 is related to the input signal attenuation, the attenuation of an input signal can be decreased.

The input of the buffer circuit 6 is set to a high input impedance, in a manner similar to the J-FET 2. The capacitance of the parasitic capacitance 4, or a junction capacitance, with a relatively small absolute value makes it possible to reduce the drive capability of the buffer circuit 6. This feature contributes to simplification of the configuration of the buffer circuit 6, to reduction in the number of constituent elements, and to miniaturization of the chip area in integration.

Figure 2:
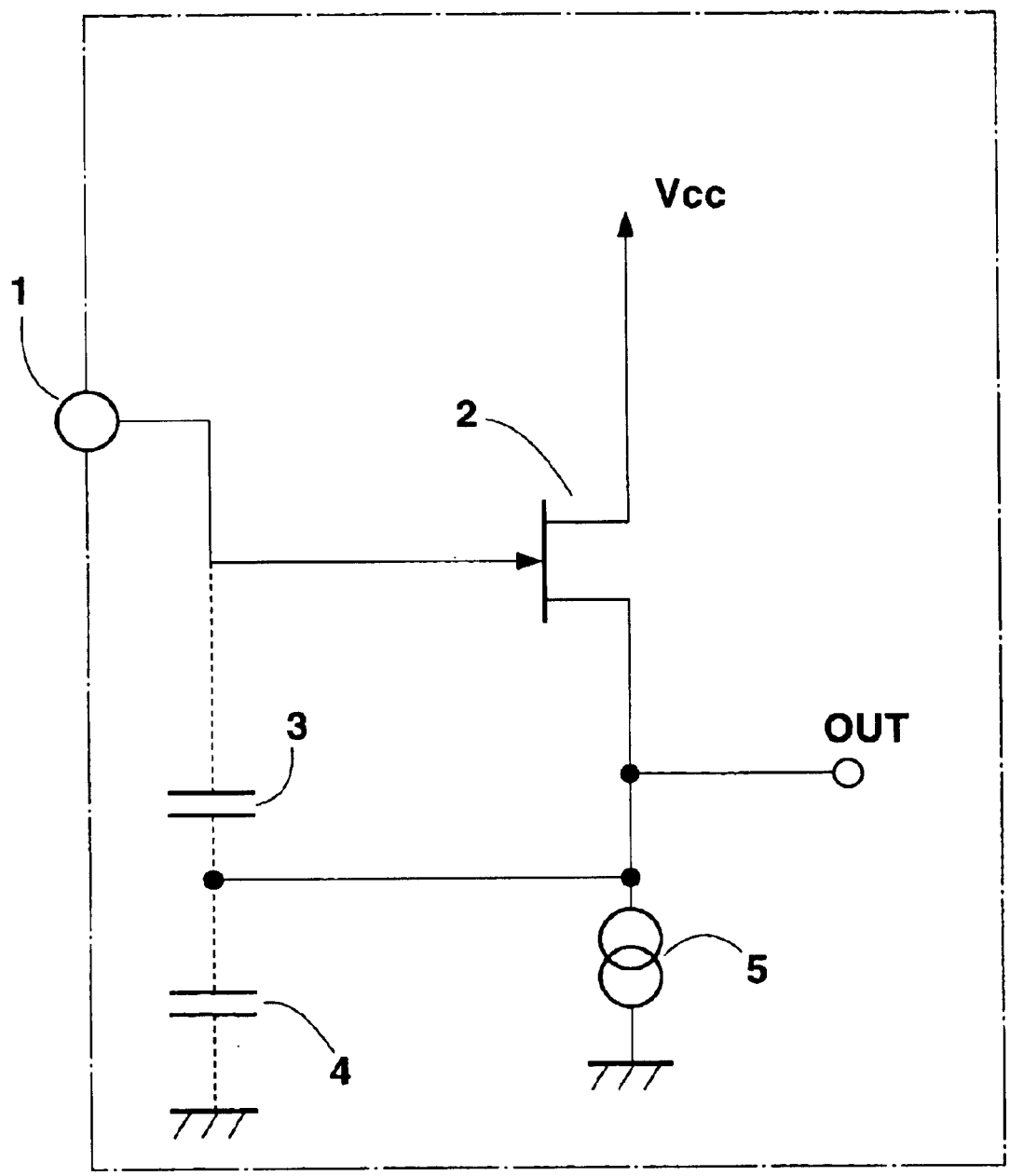
FIG. 2 is a circuit diagram illustrating an integrated circuit according to another embodiment of the present invention.

Moreover, since it is not required to boost the drive capability of the buffer circuit 6, the parasitic capacitance 4 can be charged and discharged by the source current of the J-FET. The so-called J-FET source follower circuit can charge and discharge the parasitic capacitance 4. This makes it possible to use a combination of the J-FET 2 and the buffer circuit shown in FIG. 1. FIG. 2 shows an embodiment where the J-FET 2 and the buffer circuit 6 are used as one unit. Referring to FIG. 2, the source of the J-FET 2 produces and output signal and the source follower circuit of the J-FET 2 charges and discharges the parasitic capacitance 4. That is, the source of the J-FET 2 is connected to the island region 102 and the parasitic capacitances 3 and 4 are charged and discharged by the output of the J-FET 2. Referring to FIGS. 1 and 2, the J-FET 2 is used as the input stage circuit of the integrated circuit. In addition, the circuit shown in FIGS. 1 and 2 is applicable to an input stage circuit with a high input impedance, for example, an amplifier with a high input impedance including a buffer circuit.

Figure 3:
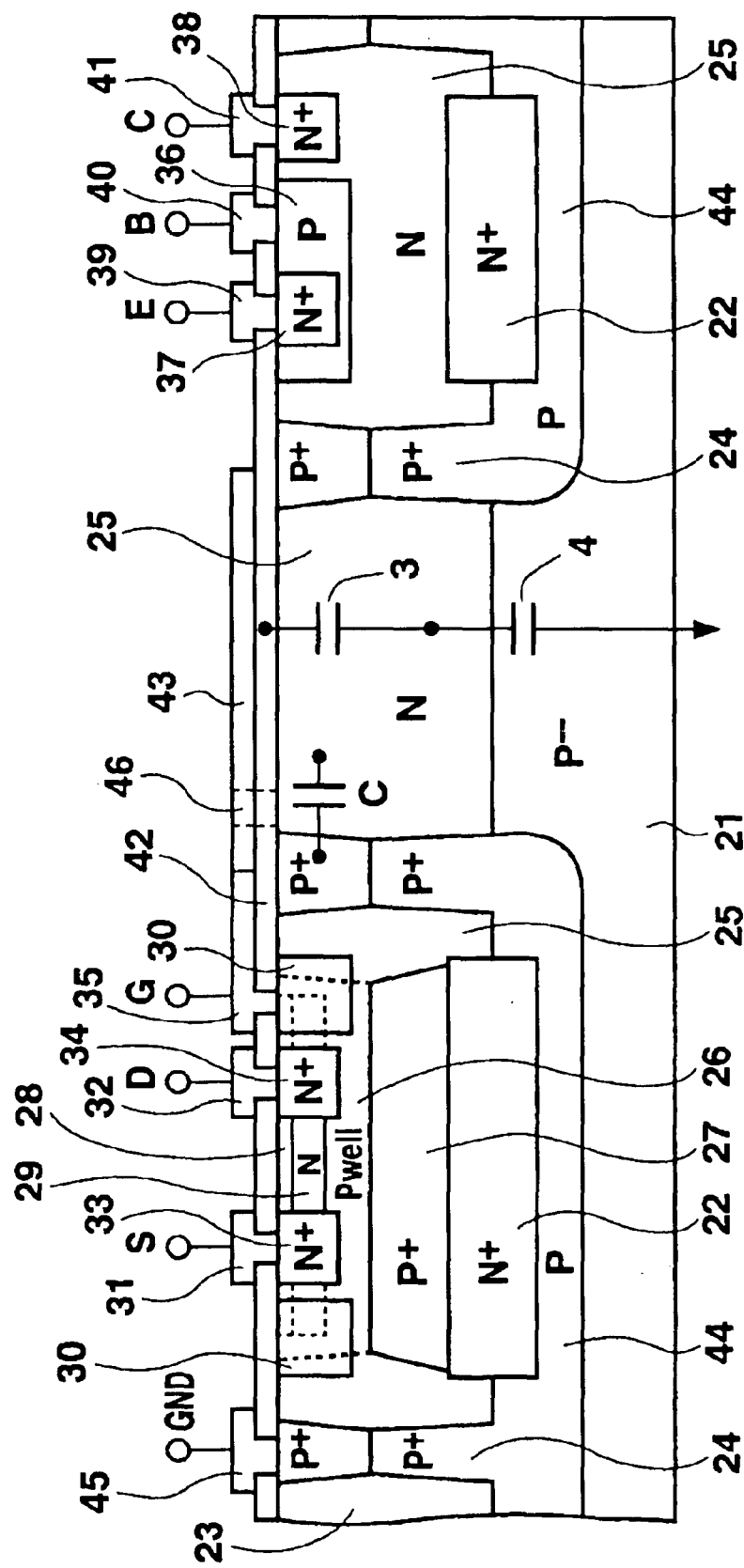
FIG. 3 is a cross-sectional view illustrating a semiconductor device integrating the circuit of FIG. 2.

FIG. 3 is a cross sectional view illustrating the structure on which the semiconductor integrated circuit of FIG. 2 are fabricated on a semiconductor substrate. An N-channel element is formed as a J-FET on the semiconductor substrate. The N-channel element is integrated on the same substrate, together with an NPN transistor.

In FIG. 3, numeral 21 represents a single-crystalline silicon substrate. Generally, the substrate used for the general bipolar integrated circuit has a specific resistance of 2 to 4 Ω·cm or 40 to 60Ω·cm at the highest value. In this application, the semiconductor substrate 21 has a very high specific resistance of 100 to 500 Ω·cm.

First, the configuration of a field effect transistor will be described here. An $N^+$ buried region 22 is formed on the surface of a semiconductor substrate. An N-type epitaxial layer 23 is formed on the $N^+$ buried region 23. The epitaxial layer 23 is electrically isolated by $P^+$ isolation regions 24 to define a plurality of island regions 25. A $P^+$ buried layer 26 is formed on the $N^+$ buried layer 22 in one of the island regions 25. The $P^+$ buried layer 26 is connected to the P-well 27 diffused from the island region 25. An N-type channel region 28 and the $P^+$ type top gate region 29 are formed on the P-well 27. The channel forming region 28 is buried in the surface of the epitaxial layer 23. The P-well 27 acts as a back gate.

A $P^+$-type gate contact regions 30 are formed so as to be superposed on the end of the channel region 28 and the end of the top gate region 29 and to cover the lightly-doped surface of the well 28. An $N^+$ type source region 31 and a drain region 32 are formed so as to penetrate the channel region. In this transistor structure, the voltage applied to the gate creates a depletion layer within the channel region 28 to control the channel current flowing between the source and the drain. Numeral 33 represents a source electrode, 34 represents a drain electrode, and 35 represents a gate electrode.

Next, the NPN bipolar transistor section will be described below. A P-type base region 36 is formed on the surface of a different island 25 of the semiconductor substrate 21. An $N^+$-type emitter region 37 is formed on the surface of the base region 36. The island region 25 acts as a collector. Numeral 38 represents an $N^+$-type collector contact region. Numeral 39 represents an emitter electrode. Numeral 40 represents a base electrode. Numeral 41 represents a collector electrode.

These electrodes make ohmic contact with the surface of the corresponding diffused regions respectively. The electrodes extends over the silicon dioxide film 42 overlying the surface of the epitaxial layer 23 to make an integrated circuit network where elements are interconnected. The gate electrode 35 to be connected to the J-FET is extended over the silicon dioxide film 42 and is connected to the pad 43 formed of a disc pattern with a diameter of, for example, 1.0 to 1.5 mm. The pad 43 corresponds to the pad 1 of FIG. 2.

In the structure below the pad 43, an island region 25 surrounded by the $P^+$-type isolation region 24 is formed under the pad 43 via the oxide film 42. A semiconductor substrate 21 of a high specific resistance is underneath the island region 25. $P^+$ isolation regions 24 having a specific resistance larger than the semiconductor substrate 21 are formed on the surface of the semiconductor substrate 21, except the lower portion underneath the pad 43. The $P^+$ isolation region 24 extends from the surface of the epitaxial layer 23 to the P-type diffused region 44.

Referring to FIG. 3, a contact 46 is formed to connect the island region 25 under the pad 43 with the source electrode 31 of the J-FET. The contact 46 is electrically isolated from the pad 43. The metal conductor 53 connects the contact 46 to the source electrode 31. The metal conductor 53 is formed on the same level as that of respective electrodes and pad 43. The metal conductor 53 (not shown in FIG. 3) will be described in detail with the plan view shown in FIG. 4.

Figure 4:
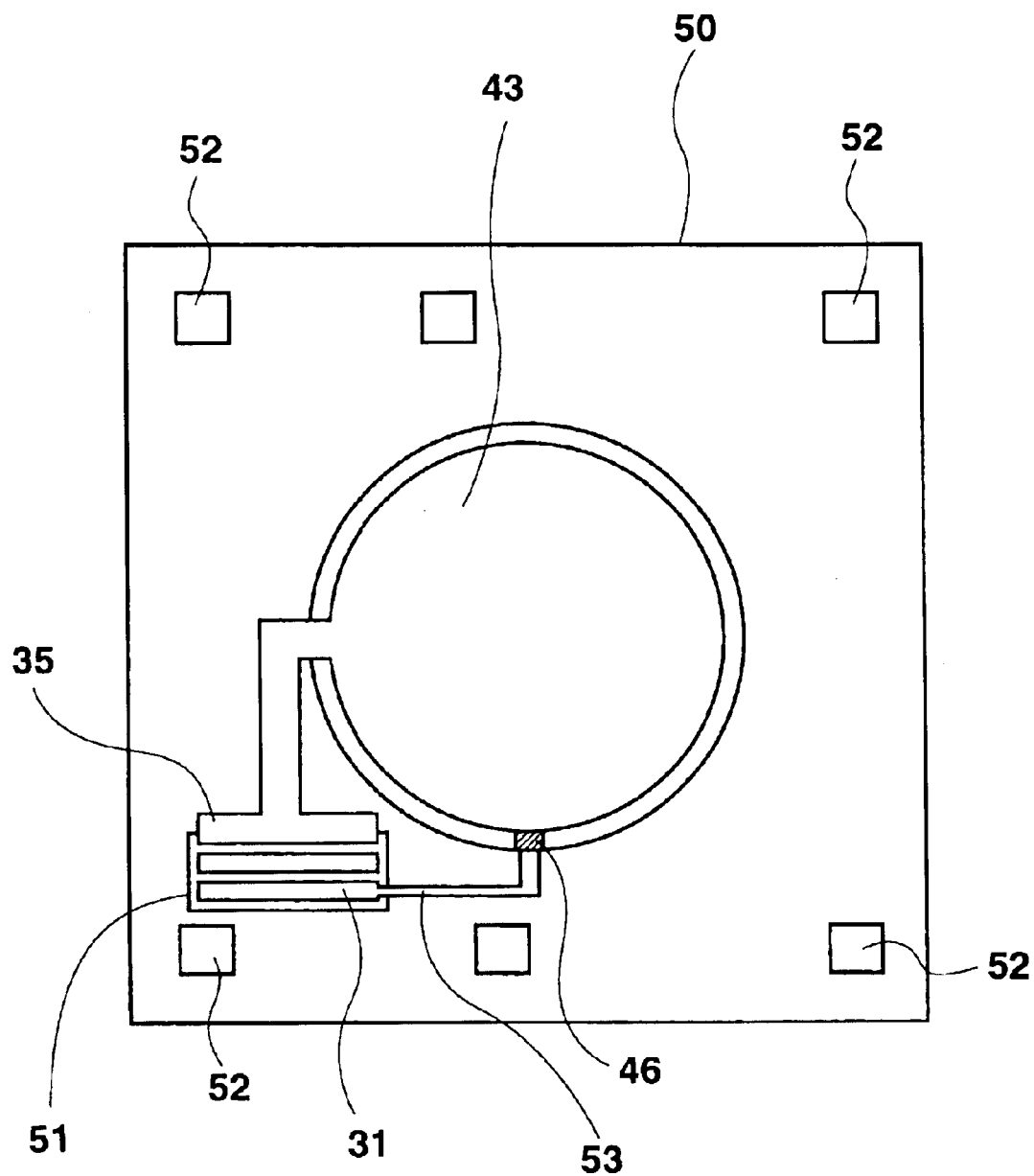
FIG. 4 is a plan view illustrating a semiconductor device integrating the circuit of FIG. 2.

FIG. 4 is a plan view illustrating the overall arrangement of the semiconductor device. The pad 43 having a diameter of 1.0 to 1.5 mm is disposed nearly at the middle portion of the semiconductor chip 50 having a chip size of 2.5×3.0 mm. A portion of the pad 43 extends to the gate electrode of the J-FET 51. The contact 46 is formed outside the pad 43. The metal conductor 53 connects the contact 46 to the source electrode of the J-FET 51. Plural bonding pads 52 for external connection are disposed on the fringes of the semiconductor chip 50. Other elements, for example, NPN transistors, resistance elements, capacitive elements, and the like are disposed so as to surround the pad 43 on the regions other than the region for the pad 43. The constant current source of FIG. 2 is disposed in the arrangement and is connected to the source electrode 31 of the J-FET.

In such a configuration, the metal conductor 53 connects the source electrode 31 of the J-FET to the contact 46 so that the island region 25 being the juncture between the parasitic capacitances 3 and 4 shown in FIG. 2 is connected to the source electrode of the J-FET 31. That is, the parasitic capacitance 3, as shown in FIG. 3 is formed of the pad 43 and the island region 25, with the oxide film 42 acting as a dielectric. The parasitic capacitance 4 is formed by the PN junction between the island 25 and the semiconductor substrate 21. The island region 25 acts as the juncture between parasitic capacitances 3 and 4. Hence, the configuration of FIG. 1 is made by connecting the island region 25 to the source of the J-FET via the contact 46.

The PN junction between the island region 25 and the P+ isolation region 24 may create a parasitic capacitance C to connect the capacitance 3 to the ground potential. However, the capacitance C is negligible in consideration of the area ratio. The conventional parasitic capacitance 4 has tens of picofarads but the capacitance C has several femtofarads.

In the configuration of the present invention, the portion under the pad 43 is merely wired to the source electrode of the J-FET with a metal conductor. Thus, the problems of the parasitic capacitance can be easily solved without adding any circuit elements.

Figure 5:
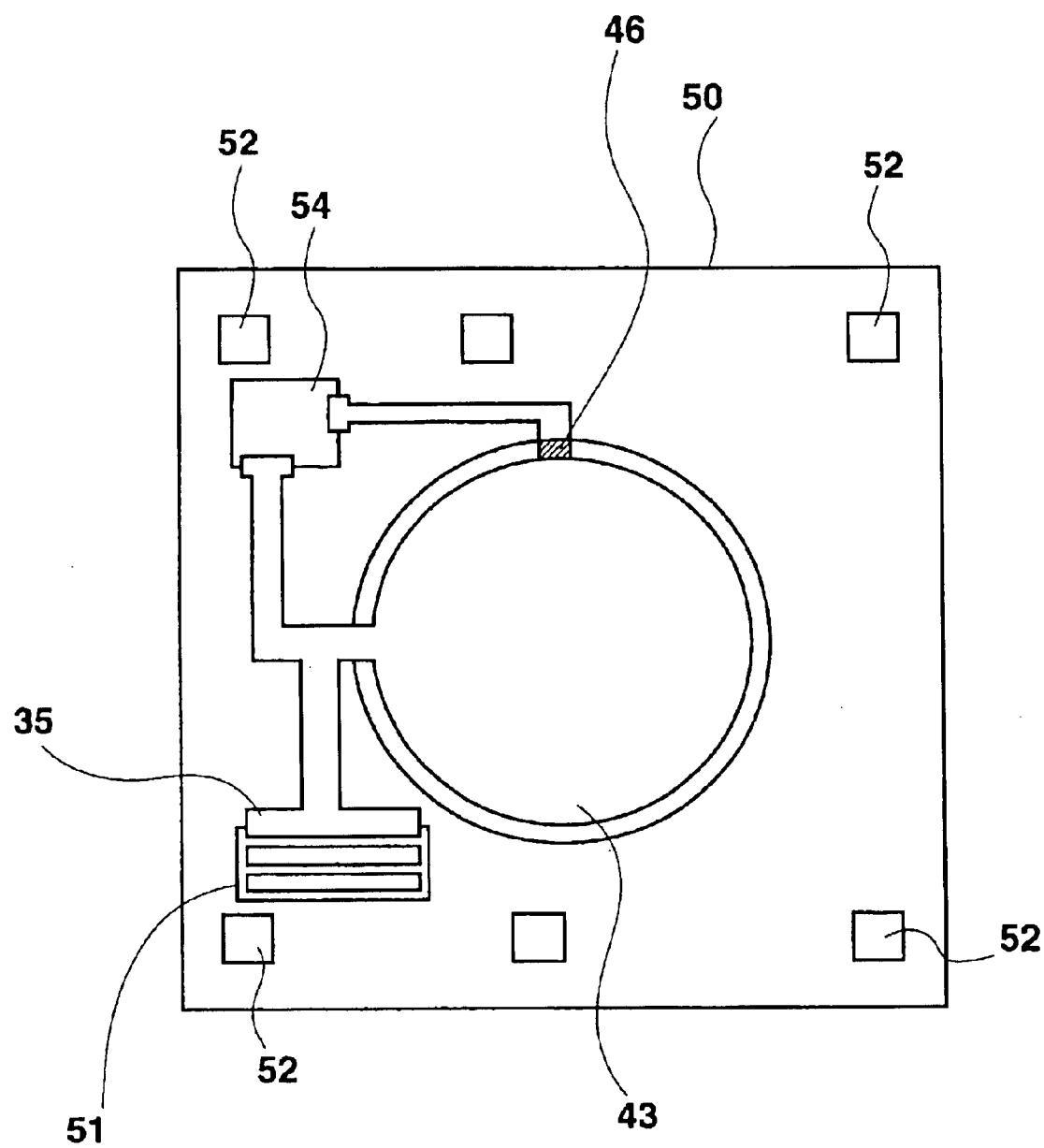
FIG. 5 is a plan view illustrating a semiconductor device integrating the circuit of FIG. 1.
Figure 6:
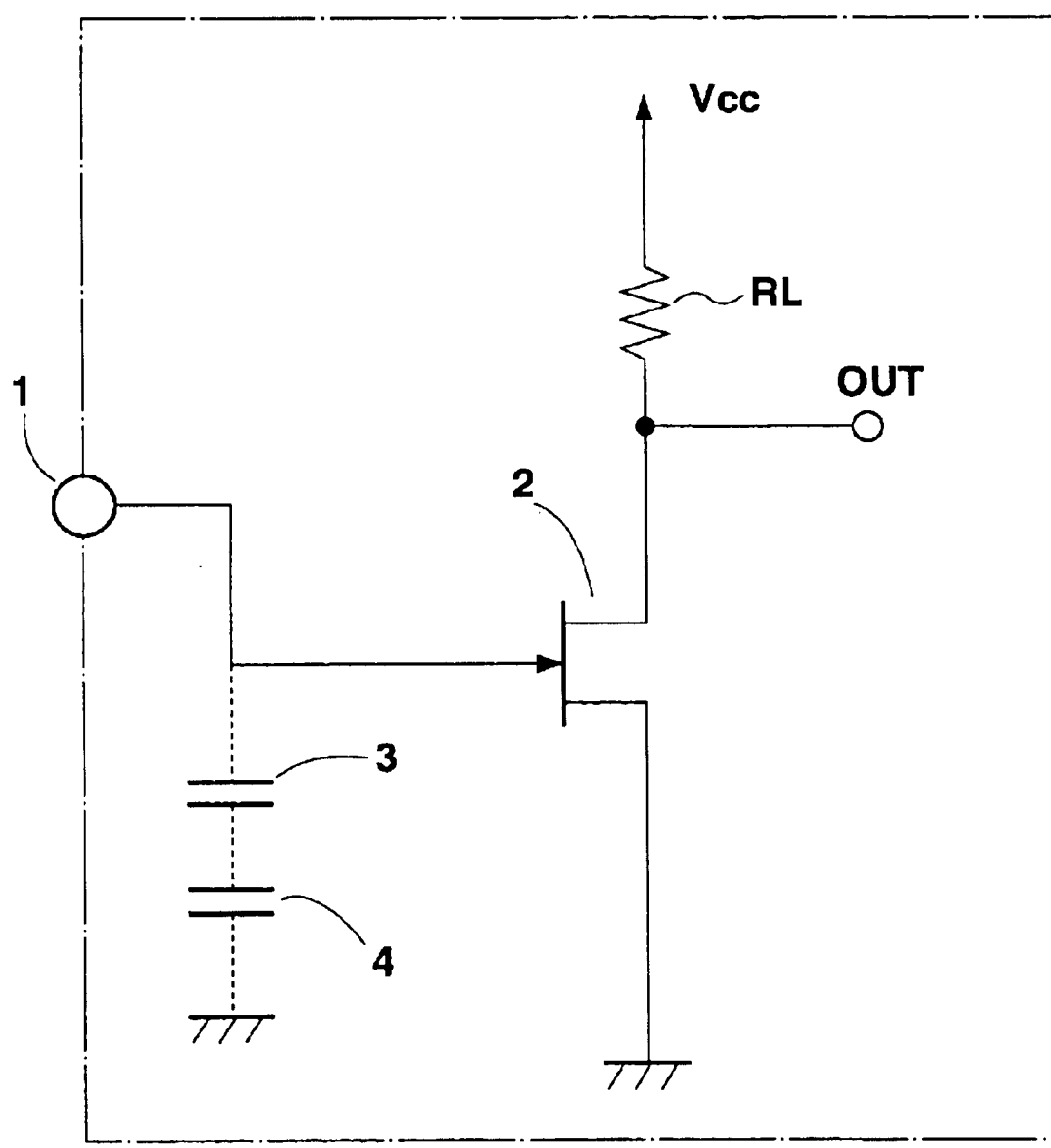
FIG. 6 is a circuit diagram illustrating a conventional integrated circuit.
Figure 7:
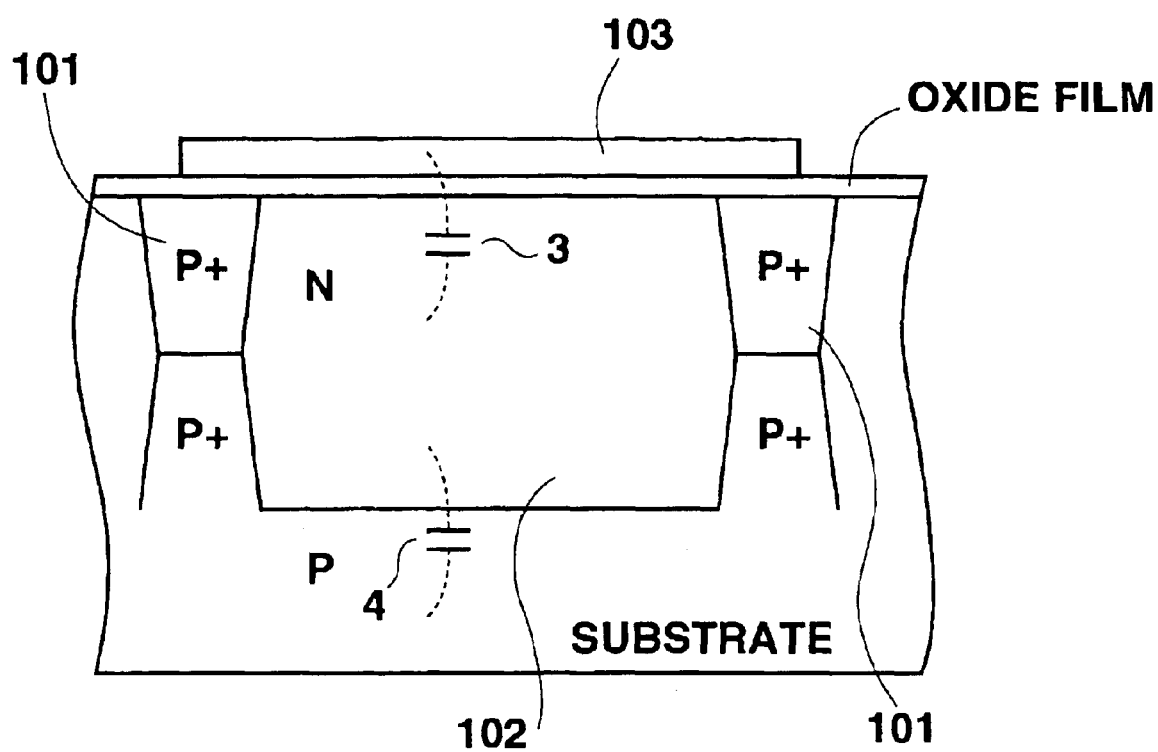
FIG. 7 is a cross-sectional view illustrating a semiconductor substrate on which an input pad is formed.

FIG. 5 is a plan view illustrating a semiconductor device corresponding to the circuit of FIG. 1. The region for the buffer circuit 54 is formed outside the pad 43. The buffer circuit 54 has the input terminal connected to the pad 43 and the output terminal connected to the island region 25 underneath the pad 43 via the contact 46. Plural bonding pads 52 for external connection are disposed on the fringes of the semiconductor chip 50. Other circuit elements, such as NPN transistors, resistance elements, capacitive elements, and the like, are disposed on regions except the pad 43 so as to surround the pad 43. The constant current source of FIG. 1 is disposed in the arrangement and is connected to the source electrode 31 of the J-FET. The connection in FIG. 5 can realize by connecting the buffer circuit 6 (54) to the juncture between the parasitic capacitances 3 and 4, as shown in FIG. 1.

According to the present invention, the circuit configuration has the pad with a high input impedance and with a low capacitance, thus preventing attenuation of an input signal to the pad.

What is claimed is:

1. A semiconductor integrated circuit comprising:
   a pad to which an input signal is externally input;
   a source follower circuit including a transistor having a gate connected to said pad and a source for producing an output signal at an output terminal of the source follower circuit, said gate is separately provided from said pad;
   wherein a parasitic capacitance is created between said pad and a semiconductor substrate, and said source of the source follower circuit is connected to the semiconductor substrate side of the parasitic capacitance so as to charge and discharge the parasitic capacitance by the output signal of said source follower circuit;
   an island region on the upper surface of said semiconductor substrate containing impurities of a second conductivity type, and the pad formed on said island region via an oxide film; and wherein said semiconductor substrate contains impurities of a first conductivity type; and wherein the output terminal of said source follower circuit is connected to said island region.

2. The semiconductor integrated circuit defined in claim 1, wherein said island region is surrounded with an isolation region containing impurities of said first conductivity type.

3. The semiconductor integrated circuit defined in claim 1, wherein said first conductivity type is a P type and said conductivity type is an N type.

4. The semiconductor integrated circuit defined in claim 1, wherein said output terminal is connected to said island region by way of a metal conductor.

5. The semiconductor integrated circuit defined in claim 1, wherein said source follower circuit comprises an amplifier.

6. The semiconductor integrated circuit defined in claim 1, wherein said transistor of said source follower circuit is a field effect transistor integrated on said semiconductor substrate.

7. The semiconductor integrated circuit defined in claim 6, wherein said field effect transistor has a drain connected to a power source, and said source connected to a ground via a constant current source, for producing said output signal.

* * * * *